US012734580B2

(12) United States Patent
Cheng et al.

(10) Patent No.: US 12,734,580 B2
(45) Date of Patent: Sep. 15, 2026

(54) METHOD FOR PRODUCING TANTALUM POWDER FOR CAPACITORS BY REDUCING TANTALUM OXIDE WITH ALKALINE EARTH METAL

(71) Applicant: NINGXIA ORIENT TANTALUM INDUSTRY CO., LTD., Shizuishan (CN)

(72) Inventors: Yuewei Cheng, Shizuishan (CN); Jinfeng Zheng, Shizuishan (CN); Hongyuan Liang, Shizuishan (CN); Shun Guo, Shizuishan (CN); Haiyan Ma, Shizuishan (CN); Jingyi Zuo, Shizuishan (CN); Li Zhang, Shizuishan (CN); Hongjie Qin, Shizuishan (CN); Tong Liu, Shizuishan (CN); Ying Wang, Shizuishan (CN)

(73) Assignee: NINGXIA ORIENT TANTALUM INDUSTRY CO., LTD., Shizuishan (CN)

( * ) Notice: Subject to any disclaimer, the term of this patent is extended or adjusted under 35 U.S.C. 154(b) by 479 days.

(21) Appl. No.: 18/288,855

(22) PCT Filed: Aug. 24, 2022

(86) PCT No.: PCT/CN2022/114372
§ 371 (c)(1),
(2) Date: Oct. 30, 2023

(87) PCT Pub. No.: WO2023/109170
PCT Pub. Date: Jun. 22, 2023

(65) Prior Publication Data

US 2024/0198422 A1 Jun. 20, 2024

(30) Foreign Application Priority Data

Dec. 15, 2021 (CN) ......................... 202111533332.2

(51) Int. Cl.
*B22F 9/20* (2006.01)
*B22F 1/142* (2022.01)
(Continued)

(52) U.S. Cl.
CPC ................ *B22F 9/20* (2013.01); *B22F 1/142* (2022.01); *B22F 1/145* (2022.01); *C22B 34/24* (2013.01);
(Continued)

(58) Field of Classification Search
CPC .. B22F 9/20; B22F 1/142; B22F 1/145; B22F 2201/11; B22F 2201/20; B22F 2301/20;
(Continued)

(56) References Cited

U.S. PATENT DOCUMENTS 2,950,966 A 8/1960 Foos
3,415,639 A 12/1968 Gustav et al.
(Continued)

FOREIGN PATENT DOCUMENTS

AU 4978590 A 8/1990
BE 1002754 A3 5/1991
(Continued)

OTHER PUBLICATIONS

English language abstract and machine-assisted English translation for JP 2005-001920 A extracted from espacenet. com database on Nov. 1, 2024, 35 pages.
(Continued)

*Primary Examiner* — Rebecca Janssen
(74) *Attorney, Agent, or Firm* — Howard & Howard Attorneys PLLC

(57) ABSTRACT

A method produces tantalum powder by reducing tantalum oxide with an alkaline earth metal. The method includes (1) mixing tantalum oxide with an excessive alkaline earth metal reducing agent, simultaneously mixing at least one
(Continued)

alkali metal and/or alkaline earth metal halide accounting for 10-200% of the weight of the tantalum oxide, heating the mixture to a temperature of 700-1200° C. in a furnace filled with inert gas, and soaking so that the tantalum oxide and reducing agent are subjected to a reduction reaction; (2) at the end of soaking, lowering the temperature to 600-800° C., vacuumizing the interior of the furnace to 10 Pa or less, and soaking under the negative pressure so that the excessive magnesium and tantalum powder mixture are separated; (3) thereafter, raising the temperature of the furnace to 750-1200° C. in the presence of inert gas, and soaking so that the tantalum powder is further sintered in the molten salt; (4) then cooling to room temperature and passivating to obtain a mixed material containing halide and tantalum powder; and (5) separating the tantalum powder from the mixture.

16 Claims, 1 Drawing Sheet

(51) Int. Cl.
*B22F 1/145* (2022.01)
*C22B 34/24* (2006.01)
*H10D 1/60* (2025.01)

(52) U.S. Cl.
CPC ....... *B22F 2201/11* (2013.01); *B22F 2201/20* (2013.01); *B22F 2301/20* (2013.01); *B22F 2998/10* (2013.01); *B22F 2999/00* (2013.01); *H10D 1/60* (2025.01)

(58) Field of Classification Search
CPC .............. B22F 2998/10; B22F 2999/00; B22F 2009/245; H10D 1/60; C22B 5/04; C22B 9/006; C22B 9/04; C22B 34/24; C22C 1/045; H01G 9/0029; H01G 9/042; H01G 9/0525
See application file for complete search history.

(56) References Cited

U.S. PATENT DOCUMENTS

| | | | |
|---|---|---|---|
| 3,647,415 A | 3/1972 | Yano et al. | |
| 4,490,340 A | 12/1984 | Ritsko et al. | |
| 5,068,097 A | 11/1991 | Eckert et al. | |
| 5,242,481 A | 9/1993 | Kumar | |
| 5,620,936 A | 4/1997 | Felix et al. | |
| 5,635,146 A | 6/1997 | Singh et al. | |
| 6,338,832 B1 | 1/2002 | Brown et al. | |
| 6,786,951 B2 | 9/2004 | He et al. | |
| 7,399,335 B2 | 7/2008 | Shekhter et al. | |
| 8,562,765 B2 | 10/2013 | Yuan | |
| 11,508,529 B2 | 11/2022 | Sungail et al. | |
| 2003/0070509 A1 | 4/2003 | Osako et al. | |
| 2003/0110890 A1* | 6/2003 | He | B22F 9/24 75/363 |
| 2006/0213327 A1 | 9/2006 | Shekhter et al. | |
| 2007/0178040 A1 | 8/2007 | Kikuyama et al. | |
| 2017/0072462 A1 | 3/2017 | Li et al. | |
| 2020/0206709 A1 | 7/2020 | Leclaire et al. | |

FOREIGN PATENT DOCUMENTS

| | | | |
|---|---|---|---|
| BR | 9000642 | | 1/1991 |
| BR | 9000642 | A | 1/1991 |
| CN | 1052070 | A | 6/1991 |
| CN | 1023548 | C | 1/1994 |
| CN | 1251325 | A | 4/2000 |
| CN | 1308566 | A | 8/2001 |
| CN | 1340631 | A | 3/2002 |
| CN | 1382548 | A | 12/2002 |
| CN | 1410209 | A | 4/2003 |
| CN | 1278804 | C | 10/2006 |
| CN | 101146918 | A | 3/2008 |
| CN | 101574741 | A | 11/2009 |
| CN | 102120258 | A | 7/2011 |
| CN | 101189089 | B | 9/2011 |
| CN | 202072753 | U | 12/2011 |
| CN | 202072754 | U | 12/2011 |
| CN | 202072755 | U | 12/2011 |
| CN | 102120258 | B | 12/2012 |
| CN | 103274468 | A | 9/2013 |
| CN | 102994780 | B | 5/2014 |
| CN | 104310323 | A | 1/2015 |
| CN | 102990076 | B | 2/2015 |
| CN | 104386751 | A | 3/2015 |
| CN | 204430275 | U | 7/2015 |
| CN | 104918734 | A | 9/2015 |
| CN | 104936729 | A | 9/2015 |
| CN | 105033283 | A | 11/2015 |
| CN | 105665731 | A | 6/2016 |
| CN | 105883919 | A | 8/2016 |
| CN | 105051223 | B | 7/2018 |
| CN | 110156082 | A | 8/2019 |
| CN | 111850686 | A | 10/2020 |
| CN | 112011804 | A | 12/2020 |
| CN | 112267017 | A | 1/2021 |
| CN | 112592180 | A | 4/2021 |
| CN | 114057227 | A | 2/2022 |
| CN | 114192791 | A | 3/2022 |
| CN | 114210973 | A | 3/2022 |
| CN | 217120272 | U | 8/2022 |
| CN | 114210973 | B | 3/2023 |
| DE | 30 04 292 | A1 | 8/1990 |
| DE | 3904292 | A1 | 8/1990 |
| DE | 291978 | A5 | 7/1991 |
| EP | 0665302 | B1 | 5/2000 |
| EP | 3486338 | A1 | 5/2019 |
| GB | 1094283 | A | 12/1967 |
| GB | 2233349 | B | 3/1994 |
| GB | 0619842 | | 10/2006 |
| JP | H02248325 | A | 10/1990 |
| JP | H 03-362229 | A | 2/1991 |
| JP | H0336229 | A | 2/1991 |
| JP | 2003013115 | A | 1/2003 |
| JP | 2005001920 | A | 1/2005 |
| JP | 2006263504 | A | 10/2006 |
| JP | 2007277091 | A | 10/2007 |
| JP | 2009167065 | A | 7/2009 |
| JP | 2019163542 | A | 9/2019 |
| WO | 0067936 | A1 | 11/2000 |
| WO | 2008041007 | A1 | 4/2008 |

OTHER PUBLICATIONS

English language abstract and machine-assisted English translation for JP 2007-277091 A extracted from espacenet. com database on Nov. 1, 2024, 15 pages.

English language abstract and machine-assisted English translation for JP 2009-167065 A extracted from espacenet. com database on Nov. 1, 2024, 15 pages.

International Search Report for Application No. PCT/CN2022/114372 dated Nov. 30, 2022, 6 pages.

English language abstract and machine-assisted English translation for CN 1052070 A extracted from espacenet.com database on Sep. 28, 2023, 5 pages.

English language abstract and machine-assisted English translation for CN 1023548 C extracted from espacenet.com database on Sep. 28, 2023, 4 pages.

English language abstract for CN 1251325 A extracted from espacenet. com database on Sep. 28, 2023, 2 pages.

English language abstract and machine-assisted English translation for CN 1308566 A extracted from espacenet.com database on Sep. 28, 2023, 33 pages.

English language abstract for CN 1340631 A extracted from espacenet. com database on Sep. 28, 2023, 1 page.

English language abstract and machine-assisted English translation for CN 1382548 A extracted from espacenet.com database on Sep. 28, 2023, 12 pages.

(56) References Cited

OTHER PUBLICATIONS

English language abstract for CN 1410209 A extracted from espacenet.com database on Sep. 28, 2023, 2 pages.
English language abstract and machine-assisted English translation for CN 1278804 C extracted from espacenet.com database on Sep. 28, 2023, 13 pages.
English language abstract for CN 101574741 A extracted from espacenet.com database on Sep. 28, 2023, 2 pages.
English language abstract and machine-assisted English translation for CN 202072753 U extracted from espacenet.com database on Sep. 28, 2023, 11 pages.
English language abstract and machine-assisted English translation for CN 202072754 U extracted from espacenet.com database on Sep. 28, 2023, 11 pages.
English language abstract and machine-assisted English translation for CN 202072755 U extracted from espacenet.com database on Sep. 28, 2023, 13 pages.
English language abstract and machine-assisted English translation for CN 102120258 B extracted from espacenet.com database on Sep. 28, 2023, 18 pages.
English language abstract and machine-assisted English translation for CN 102994780 B extracted from espacenet.com database on Sep. 28, 2023, 16 pages.
English language abstract and machine-assisted English translation for CN 102990076 B extracted from espacenet.com database on Sep. 28, 2023, 13 pages.
English language abstract and machine-assisted English translation for CN 204430275 U extracted from espacenet.com database on Sep. 28, 2023, 8 pages.
English language abstract for CN 104918734 A extracted from espacenet.com database on Sep. 28, 2023, 2 pages.
English language abstract and machine-assisted English translation for CN 104936729 A extracted from espacenet.com database on Sep. 28, 2023, 13 pages.
English language abstract for CN 105033283 A extracted from espacenet.com database on Sep. 28, 2023, 2 pages.
English language abstract and machine-assisted English translation for CN 105051223 B extracted from espacenet.com database on Sep. 28, 2023, 21 pages.
English language abstract and machine-assisted English translation for CN 112011804 A extracted from espacenet.com database on Sep. 28, 2023, 22 pages.
English language abstract and machine-assisted English translation for CN 112267017 A extracted from espacenet.com database on Sep. 28, 2023, 19 pages.
English language abstract and machine-assisted English translation for CN 114192791 A extracted from espacenet.com database on Sep. 28, 2023, 13 pages.
English language abstract and machine-assisted English translation for CN 114210973 B extracted from espacenet.com database on Sep. 28, 2023, 17 pages.
English language abstract and machine-assisted English translation for JP 2003-013115 A extracted from espacenet.com database on Sep. 28, 2023, 7 pages.
English language abstract and machine-assisted English translation for JP 2019-163542 A extracted from espacenet.com database on Sep. 28, 2023, 19 pages.
English language abstract for and original Chinese language document of He, Ji-Lin et al., "A New Method for Making Tantalum/Niobum Powder by Reducing Ta/Nb Oxide", Aug. 2003, 3 pages.
Kryzhanov, M.V. et al., "Thermodynamic Modeling of Magnesiothermic Reduction of Niobium and Tantalum from Pentoxides", Russian Journal of Applied Chemistry, vol. 83, No. 3, 2010, pp. 379-383.
Abstract and partial English language translation for and original Chinese language document of Lu, Jianbo, "Tantalum and Niobium Patent Research". vol. 24, No. 5, Dec. 28, 2005, 18 pages.
Won, H.I. et al., "Combustion Synthesis-Derived Tantalum Powder for Solid-Electrolyte Capacitors", Journal of Alloys and Compounds, vol. 78, 2009, pp. 716-720.
English language abstract and machine-assisted English translation for CN 102120258 A extracted from espacenet.com database on Sep. 27, 2023, 18 pages.
English language abstract and machine-assisted English translation for CN 103274468 A extracted from espacenet.com database on Sep. 27, 2023, 8 pages.
English language abstract and machine-assisted English translation for CN 104310323 A extracted from espacenet.com database on Sep. 27, 2023, 16 pages.
English language abstract and machine-assisted English translation for CN 104386751 A extracted from espacenet.com database on Sep. 27, 2023, 20 pages.
English language abstract and machine-assisted English translation for CN 105665731 A extracted from espacenet.com database on Sep. 27, 2023, 12 pages.
English language abstract and machine-assisted English translation for CN 105883919 A extracted from espacenet.com database on Sep. 27, 2023, 10 pages.
English language abstract and machine-assisted English translation for CN 110156082 A extracted from espacenet.com database on Sep. 27, 2023, 14 pages.
English language abstract and machine-assisted English translation for CN 111850686 A extracted from espacenet.com database on Sep. 27, 2023, 13 pages.
English language abstract and machine-assisted English translation for CN 112592180 A extracted from espacenet.com database on Sep. 27, 2023, 14 pages.
English language abstract and machine-assisted English translation for CN 114057227 A extracted from espacenet.com database on Sep. 27, 2023, 11 pages.
English language abstract and machine-assisted English translation for CN 114210973 A extracted from espacenet.com database on Sep. 27, 2023, 15 pages.
English language abstract and machine-assisted English translation for JP 2006-263504 A extracted from espacenet.com database on Sep. 27, 2023, 14 pages.
English language abstract and original Chinese language document of Liu, Jun et al., "Technology Study of Removing S from the Product Ta2O5/Nb2O5", Ningxia Orient Tantalum Industry, vol. 24, No. 10, 2005, 3 pages.
English language abstract and original Chinese language document of Wan, Lin-sheng et al., "On Size Characteristics Controlling of High-Purity Ta2O5 Powder", Jiangxi Nonferrous Metals, vol. 22, No. 3, Sep. 2008, 4 pages.
English language abstract and original Chinese language document of Yan, Hui-juan et al., "Technological Features and the Latest Development of Impurity Separation During Tantalum (Niobium) Oxide Production by Traditional Process", Rare Metals and Cemented Carbides, vol. 44, No. 4, Aug. 2016, 6 pages.
English language abstract and original Chinese langue document of Zhou, Jie-ying et al., "Influences of Neutralization Crystallization on the Particle Size of Ta2O5 Powder", Rare Metals and Cemented Carbides, vol. 39, No. 2, Jun. 2011, 5 pages.
English language abstract for BE 1002754 A3 extracted from espacenet.com database on Sep. 27, 2023, 1 page.
English language abstract for BR 9000642 A extracted from espacenet.com database on Sep. 27, 2023, 1 page.
English language abstract for CN 101146918 A extracted from espacenet.com database on Sep. 27, 2023, 1 page.
English language abstract for CN 101189089 B extracted from espacenet.com database on Sep. 27, 2023, 2 pages.
English language abstract for DD 291978 A5 extracted from espacenet.com database on Sep. 27, 2023, 1 page.
English language abstract for DE 39 04 292 A1 extracted from espacenet.com database on Sep. 27, 2023, 1 page.
English language abstract for JPH 02-248325 A extracted from espacenet.com database on Sep. 27, 2023, 1 page.
Gupta, C.K. et al., "Preparation of High Purity Niobium", Journal of the Less-Common Metals, Vo.. 139, 1988, pp. 189-202.
International Search Report for Application No. PCT/CN2022/114374 dated Nov. 8, 2022, 2 pages.
International Search Report for Application No. PCT/CN2022/114375 dated Oct. 10, 2022, 2 pages.

(56) References Cited

OTHER PUBLICATIONS

Singh, Raj P., "Processing of Ta2O5 Powders for Electronic Applications", Journal of Electronic Materials, vol. 30, No. 12, 2001, pp. 1584-1594.
U.S. Appl. No. 18/284,211, filed Sep. 26, 2023.
U.S. Appl. No. 18/284,362, filed Sep. 27, 2023.
Liu, Jun et al., "Technology Study of Removing S from the Product Ta2O5/Nb2O5", Ningxia Orient Tantalum Industry, vol. 24, No. 10, 3 pages, 2005.
Wan, Lin-sheng et al., "On Size Characteristics Controlling of High-Purity Ta2O5 Powder", Jiangxi Nonferrous Metals, vol. 22, No. 3, 4 pages, Sep. 2008.
Yan, Hui-juan et al., "Technological Features and the Latest Development of Impurity Separation During Tantalum (Niobium) Oxide Production by Traditional Process", Rare Metals and Cemented Carbides, vol. 44, No. 4, 6 pages, Aug. 2016.
Zhou, Jie-ying et al., "Influences of Neutralization Crystallization on the Particle Size of Ta2O5 Powder", Rare Metals and Cemented Carbides, vol. 39, No. 2, 5 pages, Jun. 2011.
English language abstract for JPH 03-36229 A extracted from espacenet. com database on Aug. 6, 2024, 2 pages.

* cited by examiner

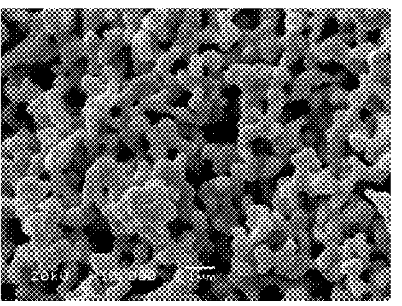

METHOD FOR PRODUCING TANTALUM POWDER FOR CAPACITORS BY REDUCING TANTALUM OXIDE WITH ALKALINE EARTH METAL

CROSS REFERENCE TO RELATED APPLICATION

The present application is the National Stage of International Patent Application No. PCT/CN2022/114372, filed on Aug. 24, 2022, which claims priority to and all the benefits of Chinese Application No. 202111533332.2, filed on Dec. 15, 2021, which are hereby expressly incorporated herein by reference in their entirety.

TECHNICAL FIELD

The present invention belongs to the field of smelting of rare metal functional materials, and particularly relates to tantalum powder for manufacturing a high-voltage high-reliability capacitor and a producing method thereof.

BACKGROUND

Tantalum electrolytic capacitor (hereinafter referred to as tantalum capacitor) has the advantages of high capacity, small volume, strong self-healing capability, high reliability and the like, and is widely applied to high-tech fields of communication, computers, automotive electronics, medical instruments, radars, aerospace, automatic control devices and the like. Tantalum powder is a key material for manufacturing tantalum capacitor, and tantalum capacitor with better reliability can be produced only by using tantalum powder for capacitors with higher withstand voltage. Therefore, only by continuously developing tantalum powder for capacitors with higher withstand voltage, tantalum capacitor produced thereby can continuously meet the requirements of high-reliability development of electronic devices and electronic circuits.

At present, industrial preparation methods of capacitor-grade tantalum powder mainly include sodium-reduction potassium fluorotantalate method, magnesium-reduction tantalum oxide method, tantalum ingot hydrogenation method and the like. The sodium-reduction potassium fluorotantalate method is characterized in that liquid metal sodium is injected when molten potassium fluorotantalate and diluent salt (such as KCl, NaCl, KF and the like) are stirred, the potassium fluorotantalate is reduced by the sodium to produce tantalum powder, and then tantalum powder for capacitors is produced through subsequent treatment. However, the tantalum powder produced by this method has poorer withstand voltage. At present, in order to improve the withstand voltage of tantalum powder produced by the sodium-reduction potassium fluorotantalate method, general methods include increasing the sintering temperature, prolonging the sintering time, but the increase of the sintering temperature and the prolongation of the sintering time inevitably reduce the specific capacitance. The tantalum ingot hydrogenation method is characterized in that, by utilizing the brittleness of metal tantalum, a tantalum ingot is hydrogenated, and then crushed into powder, followed by subsequent treatment, to produce tantalum powder for capacitors. The tantalum powder produced by this method has excellent withstand voltage, but lower specific capacitance.

The magnesium-reduction tantalum oxide method is expected to produce tantalum powder for capacitors with improved capacity and withstand voltage due to the change of the state of the reactants.

CN1308566A (application No. 99808374.7) discloses a method for producing tantalum powder by reducing tantalum oxide, through which magnesium vapor can pass through, with magnesium vapor. CN105033283A (application No. 201510310262.2) also discloses a method for producing tantalum powder by reducing tantalum oxide with magnesium vapor. Both the two methods, while potentially producing tantalum powder, are costly and difficult to control because of the harsh requirements for the raw materials (the raw materials are required in a form through which the gas can pass through) and the gaseous form of the reducing agent used. Moreover, the tantalum powder produced by these methods has large specific surface, strong activity and poor burning resistance, and the tantalum powder for capacitors produced is poorer not only in the breakdown voltage but also in the specific capacitance after high-voltage energization, and the withstand voltage of the tantalum powder for capacitors is not significantly improved.

CN1251325A discloses a method for producing tantalum powder by reducing tantalum oxide with alkaline earth metal or rare earth metal, wherein the reduction is carried out in two stages under controlled temperature, the first stage reduction is carried out till an average composition corresponding to $TaO_x$, wherein x=0.5-1.5, then acid washing is carried out to remove the oxide of reducing agent in the reduction product of the first stage, then the second stage reduction is carried out to produce tantalum powder. This method requires removal of the oxide of the reducing agent prior to the second stage reduction, and is cumbersome. Moreover, the method for producing tantalum powder still fails to significantly improve the withstand voltage of the tantalum powder for capacitors.

In the prior art, there is still a self-propagating high-temperature synthesis method (SHS) for producing tantalum powder. However, this method requires a temperature of at least 2000° C. or more, and the reaction is too fast, which is not only difficult to control, but also has high requirements on process equipment. In addition, the tantalum powder obtained is not uniform and does not meet the need for manufacturing highly reliable capacitors.

Without being bound to a general theory, after a great deal of research, the inventors find that the tantalum powder prepared by the existing methods has a lower specific capacitance under high-voltage energization conditions, and a low breakdown voltage, so the withstand voltage of the tantalum powder for capacitors fails to be significantly improved.

DISCLOSURE

An object of the present invention is to provide a method for producing tantalum powder for capacitors by reducing tantalum oxide with an alkaline earth metal such as magnesium. Compared with the tantalum powder for capacitors of the same grade produced by other methods, the tantalum powder for capacitors produced by the method has high reliability, a high specific capacitance under high-voltage energization conditions, and a high breakdown voltage, and the withstand voltage of the tantalum powder for capacitors is significantly improved. In other words, the tantalum powder for capacitors produced by the method of the present invention can withstand higher voltage and has higher reliability.

Another object of the present invention to provide a method for producing tantalum powder for capacitors which is simple in process and easier to operate and control. Accordingly, the present invention provides a method for producing tantalum powder by reducing tantalum oxide with an alkaline earth metal such as magnesium, comprising the steps of:

(1) mixing tantalum oxide with an excessive alkaline earth metal reducing agent, simultaneously mixing at least one alkali metal and/or alkaline earth metal halide accounting for 10-200% of the weight of the tantalum oxide, loading the obtained mixture into a container, putting the container in a heating furnace, raising the temperature of the heating furnace to 700-1200° C. in the presence of an inert gas, and soaking (or maintaining) for 1-10 h for example, so that the tantalum oxide and the reducing agent are subjected to a sufficient reduction reaction;
(2) at the end of soaking, lowering the temperature of the heating furnace to 600-800° C. vacuumizing the interior of the heating furnace to 10 Pa or less, soaking under the negative pressure for 1-10 h for example, so that the excessive magnesium and the tantalum powder mixture are separated;
(3) thereafter, raising the temperature of the heating furnace to 750-1200° C. in the presence of an inert gas, and soaking for 1-10 h for example, so that the tantalum powder is further sintered in the molten salt;
(4) then cooling to room temperature and passivating to obtain a mixed material containing halide and tantalum powder;
(5) separating the tantalum powder from the resulting mixture, for example by water washing, acid washing, filtration, and drying.

The alkaline earth metal reducing agent of step (1) is preferably magnesium, more preferably magnesium particles. The particle size of the magnesium particles is not limited. However, after a great deal of research, the inventors find that magnesium particles with the particle size of 150-4000 μm are more suitable for this technology, and the tantalum powder obtained by reduction has better withstand voltage. The magnesium particles with the particle size range are not only beneficial to the safety during storage and transportation of the metal magnesium, but also beneficial to the uniform mixing. If the magnesium particles are too fine, the activity is too strong, and spontaneous combustion and ignition are easy to occur; if the magnesium particles are too coarse, uniform mixing is not so easy, and the performance optimization of the tantalum powder is not so easy. The amount of excessive reducing agent added is an amount exceeding the theoretical amount for complete reduction of tantalum oxide. Generally, the theoretical amount is 0.273 kg for complete reduction of one kilogram of tantalum oxide. In the present invention, it is preferred that the amount exceeds 50-300%, preferably 50-200%, more preferably 100-200%, still more preferably 50-100% or 70-150%, still more preferably 90-120%, most preferably 100-150% of the theoretical amount.

In step (1), sintering of tantalum powder inevitably occurs to a certain degree due to the occurrence of reduction heat. After a great deal of research, the inventors find that a certain reduction heat can be absorbed by adding excessive metal magnesium and alkali metal or alkaline earth metal halide, and the sintering of the tantalum powder by the reduction heat can be adjusted, so that the sintering of the tantalum powder by the reduction heat reaches a proper degree, and the withstand voltage of the tantalum powder is favorably improved.

It is preferred that the amount of alkali metal and/or alkaline earth metal halide added in step (1) is 10-180%, preferably 25-120%, more preferably 70-120% or 100-180%, most preferably 15-80%, for example 25-80% by weight of the tantalum oxide. The alkali metal and/or alkaline earth metal halide is preferably in particulate form. The particle size thereof is not limited, but the inventors find that the particles of 70-4000 μm are more suitable for this technology, and the tantalum powder obtained by reduction has better withstand voltage.

The inert gas generally refers to rare gases such as helium, neon, and argon. Although nitrogen is sometimes used as an inert gas due to its stable properties, it is not suitable as an inert protective gas in the present invention because the reduction temperature is relatively high and the activity of nitrogen is very strong at this high temperature. However, after a great deal of research, the inventors find that the nitrogen doping of the tantalum powder can be achieved by the way when a small amount of nitrogen is contained in the inert gas without damaging the inert protective atmosphere. From the viewpoint of achieving a better nitrogen doping effect of the tantalum powder, the inert gas in step (1) may preferably contain 0.5 to 10% of nitrogen.

Preferably, the alkali metal or alkaline earth metal halide in step (1) is one or more of NaCl, KCl, KF, KI, and/or $MgCl_2$. The alkali metal halide may be sodium chloride and/or potassium chloride, preferably a mixture of sodium chloride and potassium chloride, more preferably a mixture of sodium chloride and potassium chloride in a ratio of 1:1-10, most preferably about 1:1.

Preferably, one or more compounds containing B. P and/or N elements can be added as additive(s) in step (1) to dope the tantalum powder. Based on the amount of effective element, the B element is preferably added in an amount of 1-100 ppm, more preferably 20-60 ppm; the P element is preferably added in an amount of 10-200 ppm, more preferably 30-90 ppm; the N element is preferably added in an amount of 300-2500 ppm, more preferably 500-1200 ppm. It should be understood that although the compound(s) is (are) added here, the effective elements are B, P, and/or N, so the amounts referred to here are calculated as B, P and/or N.

Preferably, in step (1), the heating furnace is heated to 750-1000° C. More preferably, the heating furnace is heated to 900-1000° C.

In step (2), because the melting point of the metal magnesium is relatively high, magnesium vapor is difficult to diffuse to the outside of the reactor, but is condensed into solid in a low-temperature zone of the reactor, thereby realizing separation.

Preferably, in step (2), the temperature of the heating furnace is 650-800° C. More preferably, the temperature of the heating furnace is 650-720° C. Preferably, the interior of the heating furnace is vacuumized (or evacuated) to 5 Pa or less, preferably 0.5 Pa or less.

The inert gas in step (3) may be the same as or different from the inert gas in step (1). Preferably, in steps (1) and/or (3), a positive pressure is maintained in the furnace.

Preferably, in step (3), the heating furnace is heated to 900-1050° C.

Preferably, the method of the present invention further comprises, after step (5), heat treatment such as high-temperature high-vacuum heat treatment, oxygen reduction, acid washing, and then separating the tantalum powder by, for example, filtration and drying, to obtain tantalum powder suitable for manufacturing high-reliability tantalum capacitors. These treatments are all processes known in the art. In other words, these treatments may employ any processes known in the art. For example, the high-temperature high-vacuum heat treatment and passivation may be performed by using processes provided in the patents CN201110039272.9, CN201120077798.1. CN201120077680.9, CN201120077305.4 and the like, the oxygen reduction may be performed by using processes provided in the patents CN201420777210.7 and CN201420777210.7, and the acid washing may be performed by using processes provided in the patents CN201210548101.3, CN201280077499.5, CN201210548008.2 and the like.

Instead of doping the N, P and/or B elements in step (1), a step of doping these elements separately may also be included in the present invention, for example, after step (5). Of course, raw materials containing these elements may be used as they are. These elements may also be added in the high-temperature high-vacuum heat treatment step described previously. It is particularly preferable to add the P element. The addition of the P element can improve the specific capacitance, and the effect of improving the specific capacitance is the same whenever the P element is added as long as the total amount of P doped is controlled well.

The product tantalum powder is briquetted, sintered, and energized under high voltage conditions, and the energized block is tested for electrical performance. It is found that the energized block has a higher specific capacitance and shows a higher breakdown voltage in the breakdown voltage test.

Compared with tantalum powder for capacitors of the same grade produced by other methods, after being energized under the same high voltage conditions, the energized block of the tantalum powder produced in the present invention has higher specific capacitance and higher breakdown voltage in the breakdown voltage test. Therefore, the tantalum powder produced in the present invention is more suitable for manufacturing high-voltage and high-reliability tantalum capacitors.

Moreover, the process of the present invention is simple and easy to control. For example, any step of the present invention does not involve the use of microwave, or the use of too high temperatures above 1300° C. Therefore, the equipment used is simpler, and the safety of the tantalum powder production process is better.

Without being bound to a general theory, through analysis of principle by combining the theory of powder liquid phase sintering, the inventors believe that the reason why the present invention achieves excellent effects resides in that: in step (1), with the rise of the temperature, the metal magnesium and the alkali metal or alkaline earth metal halide are melted and present as liquid phase, the liquid magnesium, for having higher reducibility, reduces the tantalum oxide, and the newly-generated tantalum powder particles have stronger surface activity. Under the conditions of the present invention, sintering of tantalum powder particles to a certain degree is realized by using reduction heat, and a space structure suitable for manufacturing a capacitor is constructed; then, upon further sintering in the liquid phase of the molten salt (mainly the alkali metal halide), the corners, projections of large particles in the tantalum powder and ultrafine tantalum powder particles are dissolved in the liquid phase. As the process continues, tantalum has a concentration in the liquid phase that exceeds the saturation concentration, and then preferentially deposits on certain sites in the large particles of tantalum and coalesces as a part of the large particles. As such, the tantalum powder has more uniform particle size, smooth particles, coarse sintering neck and less ultrafine particles. Thereafter, the obtained tantalum powder is subjected to high-temperature high-vacuum sintering, oxygen reduction and acid washing treatment according to the prior art, thereby obtaining tantalum powder suitable for manufacturing high-voltage high-reliability capacitors.

BRIEF DESCRIPTION OF THE DRAWINGS

The following FIGURE is provided for a better understanding of the present invention. The FIGURE is exemplary and not intended to limit the scope of the present invention.

FIG. 1 shows a scanning electron micrograph of the tantalum powder obtained according to the present invention.

The FIGURE illustrates that the obtained tantalum powder has more uniform particle size, smooth particles, coarse sintering neck and less ultrafine particles.

DESCRIPTION

Examples

In order to further illustrate the present invention, the preferred embodiments of the present invention are described in combination with the accompanying examples, from which the objects, features and advantages of the present invention can be apparent. The description is intended only to further illustrate the features and advantages of the present invention, not to limit the present invention. The examples were carried out under conventional conditions if the specific conditions are not specified. The reagents or instruments used are commercially available conventional products if the manufacturer is not specified.

For the purposes of the present specification, all numbers expressing amounts of ingredients, reaction conditions and the like in the specification and claims are to be understood as being modified in all instances by the term "about" unless otherwise indicated. Accordingly, the numerical parameters given in the following specification and attached claims are approximate values that may vary depending upon the desired properties sought to be obtained by the present invention, unless otherwise indicated. At the very least, and not intended to limit the application of the principle of equivalence in the scope of claims, each numerical parameter should be interpreted at least according to the number of reported significant digits and the usual rounding technique.

The content of impurities in the tantalum powder is analyzed according to the Chinese standard GB/T15076.1-15076.15, and the physical properties are tested according to the industry standard YS/T573-2015. The electrical performance of the tantalum powder is tested according to the Chinese standard GB/T3137.

Example 1

10.0 kg of tantalum oxide was mixed with 5.46 kg of metal magnesium particles and simultaneously with 5.0 kg of potassium chloride (KCl). After uniformly mixing, the obtained mixture was loaded into a reaction vessel, and air in the reaction vessel was separated (i.e., evacuated). Argon was introduced into the reaction vessel, and, under the condition of keeping positive pressure, the reaction vessel was put into a heating furnace for heating to a temperature of 940° C., followed by soaking for 4.0 h to fully reduce the tantalum oxide. Then, the reaction vessel was cooled to a temperature of 680° C., and vacuumized so that the pressure in the reaction vessel was lowered to 5.7 Pa, followed by soaking for 6 h, and vacuumizing was stopped. Then, argon was introduced into the reaction vessel, and, under the condition of keeping positive pressure, the reaction vessel was heated to 940° C., followed by soaking for 5 h, so that the tantalum powder was sintered in the molten halide. After the soaking was finished, the reaction vessel was cooled to room temperature, and passivation treatment was carried out. Thereafter, the obtained mixture of the halide and the tantalum powder was subjected to water washing, acid washing, filtering and drying, so as to separate the tantalum powder.

Next, the tantalum powder was doped with 50 ppm P, and subjected to high-temperature high-vacuum heat treatment for 0.5 h at 1400° C. and under a pressure of less than $5.0\times10^{-3}$ Pa, and then to oxygen reduction and acid cleaning to obtain the final tantalum powder. The final tantalum powder obtained was made into an anode block according to the anode block mass, pressed density, anode block sintering temperature, sintering time specified in Table 1, and other conditions as per the above-mentioned standard GB/T3137 requirements, energized at 200 V, and then tested for electrical properties as per the above-mentioned GB/T3137 requirements. The test results are listed in Table 1.

Example 2

10.0 kg of tantalum oxide was mixed with 5.46 kg of metal magnesium particles and simultaneously with 2.5 kg of potassium chloride (KCl) and 2.5 kg of sodium chloride (NaCl). After uniformly mixing, the obtained mixture was loaded into a reaction vessel, and air in the reaction vessel was separated. Argon was introduced into the reaction vessel, and, under the condition of keeping positive pressure, the reaction vessel was put into a heating furnace for heating to a temperature of 940° C., followed by soaking for 1.0 h. Then, the reaction vessel was cooled to a temperature of 650° C., and vacuumized so that the pressure in the reaction vessel was lowered to 5.7 Pa, followed by soaking for 8 h, and vacuumizing was stopped. Then, argon was introduced into the reaction vessel, and, under the condition of keeping positive pressure, the reaction vessel was heated to 940° C., followed by soaking for 3 h. After the soaking was finished, the reaction vessel was cooled to room temperature, and passivation treatment was carried out. Thereafter, the obtained mixture of the halide and the tantalum powder was subjected to water washing, acid washing, filtering and drying, so as to separate the tantalum powder.

Next, the tantalum powder was doped with 50 ppm P, and subjected to high-temperature high-vacuum heat treatment for 0.5 h at 1400° C. and under a pressure of less than $5.0\times10^{-3}$ Pa, and then to oxygen reduction and acid cleaning to obtain the final tantalum powder. The final tantalum powder obtained was made into an anode block according to the anode block mass, pressed density, anode block sintering temperature, sintering time specified in Table 1, and other conditions as per the above-mentioned GB/T3137 requirements, energized at 200 V, and then tested for electrical properties as per the above-mentioned GB/T3137 requirements. The test results are listed in Table 1.

Example 3

10.0 kg of tantalum oxide was mixed with 4.00 kg of metal magnesium particles and simultaneously with 3.0 kg of potassium chloride (KCl). After uniformly mixing, the obtained mixture was loaded into a reaction vessel, and air in the reaction vessel was separated. Argon was introduced into the reaction vessel, and, under the condition of keeping positive pressure, the reaction vessel was put into a heating furnace for heating to a temperature of 900° C., followed by soaking for 8.0 h. Then, the reaction vessel was cooled to a temperature of 680° C., and vacuumized so that the pressure in the reaction vessel was lowered to 5.7 Pa, followed by soaking for 6 h, and vacuumizing was stopped. Then, argon was introduced into the reaction vessel, and, under the condition of keeping positive pressure, the reaction vessel was heated to 900° C., followed by soaking for 6 h. After the soaking was finished, the reaction vessel was cooled to room temperature, and passivation treatment was carried out. Thereafter, the obtained mixture of the halide and the tantalum powder was subjected to water washing, acid washing, filtering and drying, so as to separate the tantalum powder.

Next, the tantalum powder was doped with 50 ppm P, and subjected to high-temperature high-vacuum heat treatment for 0.5 h at 1400° C. and under a pressure of less than $5.0\times10^{-3}$ Pa, and then to oxygen reduction and acid cleaning to obtain the final tantalum powder. The final tantalum powder obtained was made into an anode block according to the anode block mass, pressed density, anode block sintering temperature, sintering time specified in Table 1, and other conditions as per the above-mentioned GB/T3137 requirements, energized at 200 V, and then tested for electrical properties as per the above-mentioned GB/T3137 requirements. The test results are listed in Table 1.

Example 4

10.0 kg of tantalum oxide was mixed with 8.00 kg of metal magnesium particles and simultaneously with 2.0 kg of potassium chloride (KCl). After uniformly mixing, the obtained mixture was loaded into a reaction vessel, and air in the reaction vessel was separated. Argon was introduced into the reaction vessel, and, under the condition of keeping positive pressure, the reaction vessel was put into a heating furnace for heating to a temperature of 980° C., followed by soaking for 2.0 h. Then, the reaction vessel was cooled to a temperature of 720° C., and vacuumized so that the pressure in the reaction vessel was lowered to 5.7 Pa, followed by soaking for 8 h, and vacuumizing was stopped. Then, argon was introduced into the reaction vessel, and, under the condition of keeping positive pressure, the reaction vessel was heated to 980° C., followed by soaking for 3 h. After the soaking was finished, the reaction vessel was cooled to room temperature, and passivation treatment was carried out. Thereafter, the obtained mixture of the halide and the tantalum powder was subjected to water washing, acid washing, filtering and drying, so as to separate the tantalum powder.

Next, the tantalum powder was doped with 50 ppm P, and subjected to high-temperature high-vacuum heat treatment for 0.5 h at 1400° C. and under a pressure of less than $5.0\times10^{-3}$ Pa, and then to oxygen reduction and acid cleaning to obtain the final tantalum powder. The final tantalum powder obtained was made into an anode block according to the anode block mass, pressed density, anode block sintering temperature, sintering time specified in Table 1, and other conditions as per the above-mentioned GB/T3137 requirements, energized at 200 V, and then tested for electrical properties as per the above-mentioned GB/T3137 requirements. The test results are listed in Table 1.

Example 5

10.0 kg of tantalum oxide comprising a compound comprising 50 ppm boron was mixed with 4.00 kg of metal magnesium particles and simultaneously with 1.5 kg of potassium chloride (KCl) and 1.5 kg of sodium chloride (NaCl). After uniformly mixing, the obtained mixture was loaded into a reaction vessel, and air in the reaction vessel was separated. Argon was introduced into the reaction vessel, and, under the condition of keeping positive pressure, the reaction vessel was put into a heating furnace for heating to a temperature of 950° C., followed by soaking for 4.0 h. Then, the reaction vessel was cooled to a temperature of 680° C., and vacuumized so that the pressure in the reaction vessel was lowered to 5.7 Pa, followed by soaking for 6 h, and vacuumizing was stopped. Then, argon was introduced into the reaction vessel, and, under the condition of keeping positive pressure, the reaction vessel was heated to 950° C., followed by soaking for 1 h. After the soaking was finished, the reaction vessel was cooled to room temperature, and passivation treatment was carried out. Thereafter, the obtained mixture of the halide and the tantalum powder was subjected to water washing, acid washing, filtering and drying, so as to separate the tantalum powder.

Next, the tantalum powder was doped with 50 ppm P, and subjected to high-temperature high-vacuum heat treatment for 0.5 h at 1400° C. and under a pressure of less than $5.0\times10^{-3}$ Pa, and then to oxygen reduction and acid cleaning to obtain the final tantalum powder. The final tantalum powder obtained was made into an anode block according to the anode block mass, pressed density, anode block sintering temperature, sintering time specified in Table 1, and other conditions as per the above-mentioned GB/T3137 requirements, energized at 200 V, and then tested for electrical properties as per the above-mentioned GB/T3137 requirements. The test results are listed in Table 1.

Example 6

10.0 kg of tantalum oxide comprising a compound comprising 1500 ppm nitrogen was mixed with 4.00 kg of metal magnesium particles and simultaneously with 1.5 kg of potassium chloride (KCl) and 1.5 kg of sodium chloride (NaCl). After uniformly mixing, the obtained mixture was loaded into a reaction vessel, and air in the reaction vessel was separated. Argon was introduced into the reaction vessel, and, under the condition of keeping positive pressure, the reaction vessel was put into a heating furnace for heating to a temperature of 900° C., followed by soaking for 4.0 h. Then, the reaction vessel was cooled to a temperature of 680° C., and vacuumized so that the pressure in the reaction vessel was lowered to 5.7 Pa, followed by soaking for 6 h, and vacuumizing was stopped. Then, argon was introduced into the reaction vessel, and, under the condition of keeping positive pressure, the reaction vessel was heated to 900° C., followed by soaking for 6 h. After the soaking was finished, the reaction vessel was cooled to room temperature, and passivation treatment was carried out. Thereafter, the obtained mixture of the halide and the tantalum powder was subjected to water washing, acid washing, filtering and drying, so as to separate the tantalum powder.

Next, the tantalum powder was doped with 50 ppm P, and subjected to high-temperature high-vacuum heat treatment for 0.5 h at 1400° C. and under a pressure of less than $5.0\times10^{-3}$ Pa, and then to oxygen reduction and acid cleaning to obtain the final tantalum powder.

The final tantalum powder obtained was made into an anode block according to the anode block mass, pressed density, anode block sintering temperature, sintering time specified in Table 1, and other conditions as per the above-mentioned GB/T3137 requirements, energized at 200 V, and then tested for electrical properties as per the above-mentioned GB/T3137 requirements. The test results are listed in Table 1.

Example 7

10.0 kg of tantalum oxide comprising a compound comprising 80 ppm phosphorus was mixed with 4.00 kg of metal magnesium particles and simultaneously with 8.0 kg of potassium chloride (KCl). After uniformly mixing, the obtained mixture was loaded into a reaction vessel, and air in the reaction vessel was separated. Argon was introduced into the reaction vessel, and, under the condition of keeping positive pressure, the reaction vessel was put into a heating furnace for heating to a temperature of 900° C., followed by soaking for 4.0 h. Then, the reaction vessel was cooled to a temperature of 680° C., and vacuumized so that the pressure in the reaction vessel was lowered to 5.7 Pa, followed by soaking for 6 h, and vacuumizing was stopped. Then, argon was introduced into the reaction vessel, and, under the condition of keeping positive pressure, the reaction vessel was heated to 900° C., followed by soaking for 6 h. After the soaking was finished, the reaction vessel was cooled to room temperature, and passivation treatment was carried out. Thereafter, the obtained mixture of the halide and the tantalum powder was subjected to water washing, acid washing, filtering and drying, so as to separate the tantalum powder.

Then, the tantalum powder was subjected to high-temperature high-vacuum heat treatment for 0.5 h at 1400° C. and under a pressure of less than $5.0\times10^{-3}$ Pa, and then to oxygen reduction and acid cleaning to obtain the final tantalum powder. The final tantalum powder obtained was made into an anode block according to the anode block mass, pressed density, anode block sintering temperature, sintering time specified in Table 1, and other conditions as per the above-mentioned GB/T3137 requirements, energized at 200 V, and then tested for electrical properties as per the above-mentioned GB/T3137 requirements. The test results are listed in Table 1.

Comparative Example 1

10.0 kg of tantalum oxide was loaded into a rotary kiln reactor (refer to the reactor of FIG. 3 used in CN1308566A), air in the reactor was evacuated, argon was introduced into the reactor, and, under the condition of keeping positive pressure, the reactor was heated to 950° C. With rotation of the rotary kiln (facilitating the full reaction of magnesium vapor and tantalum oxide), 3.62 kg of magnesium vapor was introduced, followed by soaking for 4.0 h. After the soaking was finished, the reactor was cooled to room temperature, and passivation treatment was carried out. The obtained material was subjected to acid washing, filtering and drying, to obtain tantalum powder. As the tantalum powder was seriously sintered and could not be broken into powder when being subjected to heat treatment under the same conditions of 1400° C. and less than $5.0\times10^{-3}$ Pa as those of the examples, a lower heat treatment temperature was used herein. The tantalum powder was subjected to high-temperature high-vacuum heat treatment for 0.5 h at 1250° C. and under a pressure of less than $5.0\times10^{-3}$ Pa, and then to oxygen reduction and acid cleaning to obtain tantalum powder. The tantalum powder obtained was made into an anode block according to the anode block mass, pressed density, anode block sintering temperature, sintering time specified in Table 1, and other conditions as per the above-mentioned GB/T3137 requirements. As the tantalum block obtained by pressing the tantalum powder had too large shrinkage and serious deformation after sintering at 1450° C. and 1420° C., and the specific capacitance was only 2370 μFV/g, a lower sintering temperature of the anode block was used herein. As the anode block was broken down and could not energized at an energization voltage of 110 V during energization of the tantalum powder, it was energized at 100 V, and then tested for electrical properties as per the above-mentioned GB/T3137 requirements. The test results are listed in Table 1.

Comparative Example 2

4.0 kg of metal magnesium was loaded into a reactor (refer to the reactor used in CN1251325A) with a stirring paddle and an external blowing cooling device, air in the reactor was evacuated, argon was introduced into the reactor, and, under the condition of keeping positive pressure, the reactor was heated to 780° C. With rotation of the stirring paddle, tantalum oxide was added into the reactor in batches, with a total amount of 10.0 kg, according to the requirement of the patent CN1251325A, while controlling the temperature of the reactor at 780-800° C. The reactor was cooled to room temperature, and passivation treatment was carried out. The obtained material was subjected to acid washing, filtering and drying, to obtain tantalum powder with the oxygen content of 4%. The tantalum powder with the oxygen content of 4% was reduced once again by using 4.0 kg of metal magnesium at a temperature of 800-815° C. The obtained material was subjected to acid washing, filtering and drying, to obtain tantalum powder. As the tantalum powder was seriously sintered and could not be broken into powder when being subjected to heat treatment under the same conditions of 1400° C. and less than $5.0\times10^{-3}$ Pa as those of the examples, a lower heat treatment temperature was used herein. The tantalum powder was subjected to high-temperature high-vacuum heat treatment for 0.5 h at 1250° C. and under a pressure of less than $5.0\times10^{-3}$ Pa, and then to oxygen reduction and acid cleaning to obtain tantalum powder. The tantalum powder obtained was made into an anode block according to the anode block mass, pressed density, anode block sintering temperature, sintering time specified in Table 1, and other conditions as per the above-mentioned GB/T3137 requirements. As the tantalum block obtained by pressing the tantalum powder had too large shrinkage and serious deformation after sintering at 1450° C. and 1420° C., and the specific capacitance was only 4296 μFV/g, a lower sintering temperature of the anode block was used herein. As the anode block was broken down and could not energized at an energization voltage of 123 V during energization of the tantalum powder, it was energized at 100 V, and then tested for electrical properties as per the above-mentioned GB/T3137 requirements. The test results are listed in Table 1.

TABLE 1

Electrical performance data of finished tantalum powder

| Sample | Mass of anode block (g) | Pressed density (g/cm$^3$) | Sintering temperature of anode block (° C.) | Sintering time (min) | Forming voltage (V) | Specific capacitance (μFV/g) | Breakdown voltage (V) | Residual current (nA/μFV) |
|---|---|---|---|---|---|---|---|---|
| Example 1 | 0.15 | 6.0 | 1450 | 20 | 200 | 16380 | 305 | 0.46 |
| Example 2 | 0.15 | 6.0 | 1450 | 20 | 200 | 15630 | 309 | 0.42 |
| Example 3 | 0.15 | 6.0 | 1450 | 20 | 200 | 16600 | 312 | 0.49 |
| Example 4 | 0.15 | 6.0 | 1450 | 20 | 200 | 15800 | 298 | 0.25 |
| Example 5 | 0.15 | 6.0 | 1450 | 20 | 200 | 16000 | 304 | 0.30 |
| Example 6 | 0.15 | 6.0 | 1450 | 20 | 200 | 16750 | 293 | 0.24 |
| Example 7 | 0.15 | 6.0 | 1420 | 20 | 200 | 18640 | 263 | 0.54 |
| Comparative Example 1 | 0.15 | 6.0 | 1300 | 20 | 100 | 10950 | 110 | 21.17 |
| Comparative Example 2 | 0.15 | 6.0 | 1300 | 20 | 100 | 14950 | 124 | 14.38 |

It can be seen from Table 1 that: compared with tantalum powder for capacitors of the same grade produced by other methods, the tantalum powder produced in the present invention can be energized under higher voltage condition, and the obtained energized block has a higher specific capacitance and shows a higher breakdown voltage in the breakdown voltage test.

The invention claimed is:

1. A method for producing tantalum powder by reducing tantalum oxide with an alkaline earth metal, the method comprising the steps of:

(1) mixing tantalum oxide with an excessive alkaline earth metal reducing agent, simultaneously mixing at least one alkali metal or alkaline earth metal halide accounting for 10-200% of the weight of the tantalum oxide, heating the obtained mixture to a temperature of 700-1200° C. in a heating furnace filled with an inert gas, and soaking so that the tantalum oxide and the reducing agent are subjected to a reduction reaction;

(2) at the end of soaking, lowering the temperature of the heating furnace to 600-800° C., vacuumizing the interior of the heating furnace to 10 Pa or less, and soaking under the negative pressure so that the excessive magnesium and the tantalum powder mixture are separated;

(3) thereafter, raising the temperature of the heating furnace to 750-1200° C., in the presence of an inert gas, and soaking so that the tantalum powder is further sintered in the molten salt, wherein the inert gas in step (3) is the same as or different from the inert gas in step (1);

(4) then cooling to room temperature and passivating to obtain a mixed material containing halide and tantalum powder; and (5) separating the tantalum powder from the resulting mixture.

2. The method according to claim 1, characterized in that: the reducing agent is added in step (1) in an amount that exceeds 50-300% of the theoretical amount for complete reduction of the tantalum oxide.

3. The method according to claim 1, characterized in that: the amount of alkali metal and/or alkaline earth metal halide added in step (1) is 10-180% by weight of the tantalum oxide.

4. The method according to claim 1, characterized in that: the alkali metal or alkaline earth metal halide in step (1) is one or more of NaCl, KCl, KF, KI and $MgCl_2$.

5. The method according to claim 1, characterized in that: one or more compounds containing B, P and/or N elements are added as additive(s) in step (1) to dope the tantalum powder.

6. The method according to claim 1, characterized in that: the inert gas in step (3) is the same as the inert gas in step (1).

7. The method according to claim 5, characterized in that: based on the amount of effective element, the B element is added in an amount of 1-100 ppm; and/or the P element is added in an amount of 10-200 ppm; and/or the N element is added in an amount of 300-2500 ppm.

8. The method according to claim 1, further comprising, after step (5), at least one the following steps:

high-temperature high-vacuum heat treatment;

oxygen reduction by doping a small amount of magnesium particles; and separating by acid washing, filtration and drying.

9. The method according to claim 1, characterized in that: the alkali metal or alkaline earth metal halide in step (1) is a mixture of NaCl and KCl.

10. The method according to claim 1, characterized in that: in step (1), the obtained mixture is heated to a temperature of 750-1000° C., the inert gas contains 0.5-10% of nitrogen, and the soaking is conducted for 1-10 h.

11. The method according to claim 10, characterized in that: in step (2), the temperature of the heating furnace is lowered to 650-800° C., the interior of the heating furnace is vacuumized to 5 Pa or less, and the soaking under the negative pressure is conducted for 1-10 h.

12. The method according to claim 11, characterized in that: in step (3), the temperature of the heating furnace is raised to 900-1050° C. in the presence of the inert gas, and the soaking is conducted for 1-10 h.

13. The method according to claim 1, characterized in that: the reducing agent is added in step (1) in an amount that exceeds 50-200% of the theoretical amount for complete reduction of the tantalum oxide.

14. The method according to claim 13, characterized in that: the amount of alkali metal and/or alkaline earth metal halide added in step (1) is 25-120% by weight of the tantalum oxide.

15. The method according to claim 14, characterized in that: the alkali metal or alkaline earth metal halide in step (1) is a mixture of NaCl and KCl.

16. The method according to claim 5, characterized in that: based on the amount of effective element, the B element is added in an amount of 20-60 ppm; and/or the P element is added in an amount of 30-90 ppm; and/or the N element is added in an amount of 500-1200 ppm.

* * * * *